(12) United States Patent  (10) Patent No.: US 8,450,731 B2
Ullmann et al.  (45) Date of Patent: May 28, 2013

(54) ORGANIC ELECTRONIC CIRCUIT

(75) Inventors: Andreas Ullmann, Zirndorf (DE);
 Alexander Knobloch, Paderborn (DE);
 Jurgen Krumm, Erlangen (DE)

(73) Assignee: PolyIC GmbH & Co. KG, Furth (DE)

( * ) Notice: Subject to any disclaimer, the term of this patent is extended or adjusted under 35 U.S.C. 154(b) by 73 days.

(21) Appl. No.: 13/201,263

(22) PCT Filed: Feb. 16, 2010

(86) PCT No.: PCT/EP2010/000940
 § 371 (c)(1),
 (2), (4) Date: Oct. 4, 2011

(87) PCT Pub. No.: WO2010/094451
 PCT Pub. Date: Aug. 26, 2010

(65) Prior Publication Data
 US 2012/0112353 A1 May 10, 2012

(30) Foreign Application Priority Data

Feb. 18, 2009 (DE) .......................... 10 2009 009 442

(51) Int. Cl.
 *H01L 51/00* (2006.01)
(52) U.S. Cl.
 USPC ...... 257/40; 257/E23.079; 257/508; 257/659; 257/773; 438/82; 438/99
(58) Field of Classification Search
 USPC .................... 257/E23.079, E21.461, 40, 508, 257/531, 659, 678, 691, 758, 773; 438/82, 438/99, 478
 See application file for complete search history.

(56) References Cited

U.S. PATENT DOCUMENTS 5,323,033 A  6/1994 Matsumoto et al.
5,446,311 A * 8/1995 Ewen et al. .................... 257/531
(Continued)

FOREIGN PATENT DOCUMENTS

DE  10330064 B3  12/2004
DE  10330063 A1  2/2005
(Continued)

OTHER PUBLICATIONS

International Search Report of DE102006047388 dated Feb. 16, 2010.

*Primary Examiner* — Chris Chu
(74) *Attorney, Agent, or Firm* — William Squire; Carella Byrne Cecchi Olstein Brody & Agnello, P.C.

(57) ABSTRACT

A multi-layer film body comprises a plastic substrate strip conveyed in a first direction in a roll-to-roll process for printing electronic organic components on the substrate. A first electrically conducting layer is on the substrate, a semiconductor layer is on the first layer, an insulator layer is on the semiconductor layer and a second electrically conducting layer is on the insulator layer, the layers comprising a first interconnection assembly portion and a second electronic assembly portion successively positioned in the first direction, each portion comprising a central zone and a respective conductor tract input zone and conductor tract output zone bordering the respective central zones, the input, central and output zones of each portion each comprising parallel conductor tracts in the first conducting layer. Electrical connectors in the second conducting layer interconnect selected ones of the conductor tracts in the two portions. Regions of the semiconductor and insulating layers in the second portion are juxtaposed with electrodes formed from the first and second conducting layers in the central zone, forming organic electronic components comprising one or more of transistors, diodes, resistors and capacitors. The conductive tracts of the input zone of the first portion and the conductive tracts of the output zone of the second portion form the component inputs and outputs.

31 Claims, 3 Drawing Sheets

U.S. PATENT DOCUMENTS

Figure 1:
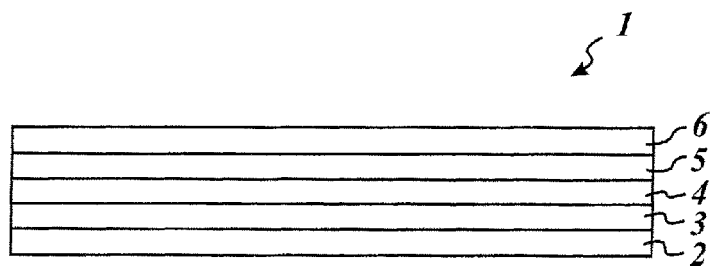

| | | | |
|---|---|---|---|
| 6,031,445 A * | 2/2000 | Marty et al. | 336/200 |
| 6,429,504 B1 * | 8/2002 | Beaussart et al. | 257/531 |
| 6,486,534 B1 * | 11/2002 | Sridharan et al. | 257/659 |
| 7,323,948 B2 * | 1/2008 | Ding et al. | 331/181 |
| 7,442,954 B2 | 10/2008 | Clemens et al. | |
| 7,619,297 B2 * | 11/2009 | Wang | 257/531 |
| 8,063,469 B2 * | 11/2011 | Barth et al. | 257/659 |
| 8,178,953 B2 * | 5/2012 | Barth et al. | 257/659 |
| 2001/0052645 A1 * | 12/2001 | Op'T Eynde et al. | 257/700 |
| 2003/0175427 A1 | 9/2003 | Loo et al. | |
| 2005/0227407 A1 | 10/2005 | Hsieh et al. | |
| 2006/0145140 A1 | 7/2006 | Fix et al. | |
| 2006/0186513 A1 * | 8/2006 | Kitaguchi | 257/659 |
| 2006/0220005 A1 | 10/2006 | Fix et al. | |
| 2008/0064189 A1 * | 3/2008 | Daubenspeck et al. | 438/465 |
| 2008/0073752 A1 * | 3/2008 | Asai et al. | 257/615 |
| 2008/0079168 A1 * | 4/2008 | Barth | 257/773 |
| 2010/0033213 A1 | 2/2010 | Ullmann et al. | |
| 2010/0078778 A1 * | 4/2010 | Barth et al. | 257/659 |

FOREIGN PATENT DOCUMENTS

| | | |
|---|---|---|
| DE | 102006047388 A1 | 4/2008 |
| EP | 1411554 A1 | 4/2004 |
| EP | 1519418 A1 | 3/2005 |
| WO | 2004047144 A2 | 6/2004 |
| WO | 2004068608 A2 | 8/2004 |
| WO | 2006059162 A1 | 6/2006 |
| WO | 2006064275 A1 | 6/2006 |
| WO | 2006106312 A1 | 10/2006 |
| WO | 2006106365 A2 | 10/2006 |
| WO | 2008041027 A1 | 4/2008 |

* cited by examiner

ORGANIC ELECTRONIC CIRCUIT

The invention concerns an organic electronic circuit in the form of a multi-layer film body which has a substrate layer, a first electrically conducting functional layer, an electrically semiconducting functional layer, an insulating layer and a second electrically conducting functional layer and a process for the production of the organic electronic circuit.

Organic electronic circuits are known for example from WO 2004/047144 A2. WO 2004/047144 A2 describes a field effect transistor of the above-indicated structure. Disposed on a substrate are source and drain electrode layers which engage into each other and which are covered in that succession with a structured semiconductor layer and an insulating layer over the full surface area. Disposed on the insulating layer is a structured gate electrode layer. Disposed between the source electrode layer and the drain electrode layer is the so-called channel, over which the gate electrode layer, here in the form of a top gate electrode, is arranged.

So that organic electronic circuits can also have a higher circuitry functionality and it therefore also becomes possible to provide more complex electronic circuits, it is firstly necessary to increase the integration density of electronic components, that is to the say the number of components per unit of surface area. In the case of printed organic electronic circuits in mass production however it may be found to be particularly difficult if the electrically conducting and electrically semiconducting materials to be printed, for affording the functional layers, only slowly dry or harden, that is to say it is difficult to print high-resolution electronic functional layers of high quality. In addition precise placement, that is to say registration, of the functional layers in mutually superposed relationship is of significance for a high level of integration density and quality of the parts.

Now the object of the present invention is to provide an improved organic electronic circuit.

The object of the invention is attained by an organic electronic circuit in the form of a multi-layer film body which has a substrate layer, a first electrically conducting functional layer, an electrically semiconducting functional layer, an insulating layer and a second electrically conducting functional layer, wherein the organic electronic circuit has two or more portions, wherein at least one first portion of the two or more portions is in the form of an interconnection assembly and shaped in said at least one first portion in the first electrically conducting functional layer are a plurality of structures which are repeated in a preferred direction and which are respectively covered by the insulating layer in a central first zone and which are respectively not covered by the insulating layer in second zones arranged on both sides of the central first zone, wherein at least one second portion of the two or more portions is in the form of an electronic assembly and shaped in said at least one second portion in the first electrically conducting functional layer are a plurality of structures which are repeated in a preferred direction and which are respectively covered in a central first zone by the electrically semiconducting functional layer and/or the insulating layer and which are not covered by the insulating layer in at least one second zone arranged adjacent to an adjacent first portion, wherein the second electrically conducting functional layer has at least one first region in which the second electrically conducting functional layer partially covers over at least one structure and preferably at least two structures of the first electrically conducting functional layer in the at least one portion in the form of the interconnection assembly and at least one structure and preferably at least two structures of the first electrically conducting functional layer in the at least one portion in the form of the electronic assembly, forming one or more electrically conducting connections, and the second electrically conducting functional layer has at least one second region in which the second electrically conducting functional layer partially covers over the at least one second portion in the form of an electronic assembly, forming an electrical component, in particular an organic diode or an organic field effect transistor.

The object of the invention is also attained by a process for the production of at least one organic electronic circuit in the form of a multi-layer film body, wherein an intermediate product of the organic electronic circuit is produced by forming on a substrate layer a first electrically conducting functional layer and further forming on the first electrically conducting functional layer at least one electrically semiconducting functional layer and at least one insulating layer, at least one first portion is in the form of an interconnection portion and shaped in said at least one first portion in the first electrically conducting functional layer are a plurality of structures which are repeated in a preferred direction and which are respectively covered by the insulating layer in a central first zone and which are respectively not covered by the insulating layer in second zones arranged on both sides of the central first zone, at least one second portion is in the form of an electronic assembly portion and shaped in said at least one second portion in the first electrically conducting functional layer are a plurality of structures which are repeated in a preferred direction and which are respectively covered in a central first zone by the electrically semiconducting functional layer and/or the insulating layer and which are not covered by the insulating layer in at least one second zone arranged adjacent to an adjacent first portion; and wherein the at least one organic electronic circuit is individualized by shaping the second electrically conducting functional layer on the intermediate product such that the second electrically conducting functional layer has at least one first region in which the second electrically conducting functional layer partially covers over at least one and preferably at least two structures of the first electrically conducting functional layer in the at least one first portion which is in the form of the interconnection assembly and at least one and preferably at least two structures of the first electrically conducting functional layer in the at least one portion which is in the form of the electronic assembly, producing one or more electrically conducting connections, and the second electrically conducting functional layer has at least one second region in which the second electrically conducting functional layer partially covers over the at least one second portion which is in the form of the electronic assembly, producing an electrical component, in particular an organic diode or an organic field effect transistor.

The invention makes it possible to produce complex organic electronic circuits inexpensively at high quality in mass production. Effective mass production of organic electronic circuits is made possible by the structure according to the invention of the organic electronic circuit. The organic electronic circuit according to the invention makes it possible to use a production process which does not require any registration. That is achieved inter alia by the specific configuration of the first electrically conducting functional layer. In addition by virtue of the structure according to the invention it is sufficient to make relatively high quality demands only in terms of the production procedure for the first electrically conducting functional layer which is preferably shaped with a high-resolution structuring method. 'Relatively coarse' processes, in particular printing processes, can be used for the production procedures for all further functional layers. In addition, by virtue of the structure according to the invention, the production process is to a certain extent error-tolerant in relation to inclined or transverse distortion in relation to the first and/or second electrically conducting functional layer. The intermediate product in accordance with the process according to the invention is preferably produced continuously in the form of a long strip, for example in the form of a film web, and in that case preferably has periodically repetitive structures in the first electrically conducting functional layer, the electrically semiconducting functional layer and the insulating layer. Such an intermediate product can be produced not only effectively and inexpensively but it can be universally employed for different organic electronic circuits involving different functionality, for it is only by the formation, that is to say individualization, of the second electrically conducting functional layer as the last functional layer applied, that the electronic components of the circuit and the interconnection thereof relative to each other are established. That also achieves further cost advantages. In addition it is possible to produce the second electrically conducting functional layer by means of a digital structuring process, for example by means of digital printing, and thus to shorten the production time and also inexpensively produce even small volumes.

Advantageous developments of the invention are recited in the appendant claims.

In an organic electronic circuit in a preferred configuration it can be provided that the plurality of structures which are repeated in a preferred direction are shaped in the form of a plurality of mutually parallel conductor tracks in the first electrically conducting functional layer. Hereinafter the term 'plurality of mutually parallel conductor tracks' can be interpreted as replaced without limitation by 'the structures which are repeated in a preferred direction'.

In a preferred embodiment the organic electronic circuit has an interconnection assembly and an electronic assembly which basically differ from a silicon chip usually employed for integrated circuits, in the materials and production procedures used. The electrically conducting, semiconducting and/or insulating functional layers of the interconnection assembly and electronic assembly respectively are formed by layers of a multi-layer film body which are applied by printing, doctor blade application, vapor deposition or sputtering. The organic electronic circuit can have in particular two or more, preferably electrically insulating, insulating layers, electrically semiconducting functional layers and/or second electrically conducting functional layers. In that case the succession in which the two or more of the preferably electrically insulating layers, the electrically semiconducting functional layers and/or the second electrically conducting functional layers are shaped can be effected as desired between the first electrically conducting functional layer and the first of the second electrically conducting functional layer. The first electrically conducting functional layer, the electrically semiconducting functional layer, the insulating layer and/or the second electrically conducting functional layer of the interconnection assembly and the electronic assembly respectively, in contrast to a silicon chip, are built up on a flexible carrier substrate comprising a plastic film, preferably of a thickness of between 10 μm and 100 μm. That film forms the substrate, that is to say the carrier substrate, of the integrated electronic circuit, that is to say the organic electronic circuit, instead of a silicon dioxide wafer in the case of an integrated electronic circuit formed on a silicon chip. Electrically semiconducting functional layers of that circuit are preferably applied in a solution and thus applied for example by printing, spraying, doctor blade application or pouring. In that respect the materials for the electrically semiconducting functional layers are preferably semiconducting functional polymers such as polythiophene, polyterthiophene, polyfluorene, pentacene, tetracene, oligothiophene, in inorganic silicon in embedded relationship in a polymer matrix, nano-silicon or polyarylamine. It is however also possible to use inorganic materials which can be applied in solution or by sputtering or vapor deposition, for example ZnO, A—Si, for shaping the electrically semiconducting functional layers.

In particular here the term organic electrical component is used to denote an electrical component which predominantly comprises organic material, in particular comprising at least 90% by weight of organic material. An individual organic electrical component is composed in that case of different layer portions with an electrical function, in particular in the form of thin layers which are not self-supporting, and further at least the portions, which can be associated with the layer portions, of a substrate on which the layer portions are disposed. In that case the individual layer portions can be formed from organic or inorganic material, wherein only organic, only inorganic, or organic and inorganic layer portions can be used in combination to form an organic electrical component. Thus an electrical component comprising an organic substrate and exclusive inorganic layer portions with an electrical function is viewed overall as an organic electrical component or an organic electronic circuit, by virtue of the usually great mass of the substrate, that is to say the carrier substrate, in comparison with the mass of the functional layers.

In an organic electronic circuit in a preferred configuration it can be provided that the electrically semiconducting functional layer and/or the insulating layer are arranged between the first electrically conducting functional layer and the second electrically conducting functional layer. In such a preferred configuration individualization of the organic electronic circuit can be effected entirely in the second electrically conducting functional layer.

It can further be provided that, in the at least one second portion, the plurality of structures which are repeated in a preferred direction and which are shaped in the first electrically conducting functional layer and which are respectively covered in a central first zone by the electrically semiconducting functional layer and/or the insulating layer are not covered by the insulating layer or by the electrically semiconducting functional layer in the at least one second zone arranged adjacent to an adjacent first portion.

In a preferred configuration of the invention the substrate layer is of a strip-shaped configuration. It can be provided that the substrate layer is flexible. The substrate layer is for example a plastic film of a thickness of between 12 μm and 200 μm, preferably between 20 μm and 50 μm. The substrate layer can be formed from a PP film (PP=polypropylene) and/or a PET film (PET=polyethylene terephthalate).

It can be provided that the substrate layer, that is to say the carrier, comprises any carrier material. It is possible for the carrier material to comprise paper, steel film and/or glass. It is also possible for the material of the carrier to comprise a composite material. The carrier is preferably of a thickness of between 10 μm and 500 μm. In addition a preferred carrier can have a bending radius of not more than 10 cm.

In a preferred configuration of the invention the two or more portions of the organic electronic circuit are arranged in a row in mutually juxtaposed relationship along an extent direction. If a film web is used as the carrier layer the extent direction is preferably oriented transversely relative to the longitudinal direction of the film web. The portions are preferably shaped in a strip configuration or rectangular. Preferably the portions respectively extend over the entire length of the film web.

In a preferred configuration of the invention three or more portions of the two or more portions form a succession in which a first portion in the form of an interconnection assembly is arranged between two second portions which are in the form of an electronic assembly. The succession produced in that way of three or more portions permits a particularly flexible circuitry design whereby the packing density can be increased.

In a preferred configuration of the invention two or more portions of the two or more portions form a succession in which the first and the last portion of the succession are in the form of a first portion in the form of an interconnection assembly. It is possible for the organic electronic circuit to be easily connected to further electronic assemblies, with its end portions.

In a preferred configuration of the invention two or more portions of the two or more portions form a succession in which two successive portions of the succession are in the form of a second portion in the form of an electronic assembly.

In a preferred configuration of the invention the plurality of mutually parallel conductor tracks of two adjacent portions in the first electrically conducting functional layer are neither formed in mutually interengaging toothed comb-shaped configuration nor galvanically conductingly interconnected. The first electrically conducting functional layer can have an area free of conductive material between the two adjacent portions. In a preferred configuration according to the invention of that kind that ensures galvanic separation of the two adjacent portions on the plane of the first electrically conductive functional layer.

In a preferred configuration of the invention each of the portions of the two or more portions has one or two strip-shaped second zones. The one or two strip-shaped second zones are provided transversely, preferably perpendicularly, to the extent direction. A second zone arranged at the edge is particularly suitable for producing conducting connections between adjacent portions in the second electrically conducting functional layer.

In a preferred configuration of the invention one or two and preferably both of the one or two strip-shaped second zones are provided at the edge in the respective portion.

In a preferred configuration of the invention the at least one and preferably at least two conductor tracks of the first electrically conducting functional layer connect at least one second zone of a portion to the at least one and preferably at least two conductor tracks of the first electrically conducting functional layer of a second zone of an adjacent portion by way of a conductor track shaped in the second electrically conducting functional layer.

In a preferred configuration of the invention shaped in the second electrically conducting functional layer in the at least one portion in the form of an interconnection assembly is at least one conducting connection in the form of an interconnection connection. The interconnection connection in the central first zone crosses over at least two conductor tracks of the first electrically conducting functional layer and is insulated by the insulating layer with respect to the first electrically conducting functional layer. The interconnection connection in one or in both of the second zones covers over at least two conductor tracks of the first electrically conducting functional layer and contacts same. That further increases the flexibility in terms of circuitry design and increases packing density.

In a preferred configuration of the invention shaped in the second electrically conducting functional layer in the at least one portion in the form of an interconnection assembly are at least two of the above-described interconnection connections which cover over and contact different conductor tracks of the first conductive layer. In a further advantageous configuration in that case at least one of the two or more interconnection connections in the central first region crosses over a conductor track of the first conductive layer, which is contacted by one of the other interconnection connections.

A preferred configuration of that kind according to the invention makes it easily possible to achieve complex interconnections of components simply by structuring the second electrically conducting functional layer.

In a preferred embodiment of the invention the first electrically conducting functional layer comprises a metallic layer. The metallic layer preferably comprises a metal selected from the group of gold, copper, aluminum and silver.

In a preferred configuration of the invention two adjacent conductor tracks of the plurality of mutually parallel conductor tracks are spaced in a and in particular each portion of the organic electronic circuit at a spacing of between 1 µm and 20 µm. Such a small spacing between two mutually parallel conductor tracks makes it possible to use a production process for the further functional layers, that is to say the electrically semiconducting functional layer, the insulating layer and the second electrically conducting functional layer, which can have an increased error tolerance.

It can further be provided that the first electrically conducting functional layer in each portion of the two or more portions has a plurality of mutually parallel conductor tracks.

In a preferred configuration of the invention one or more conductor tracks of the plurality of mutually parallel conductor tracks in a portion of the organic electronic circuit extend in the longitudinal direction of the extent direction.

In a preferred configuration of the invention the plurality of mutually parallel conductor tracks of the first electrically conducting functional layer in the at least one second portion are at least portion-wise arranged in mutually interengaging toothed comb-shaped relationship or shaped in a meander shape. Areas with conductor tracks arranged in toothed comb-like interengagement are used to provide organic diodes or field effect transistors. Conductor tracks which are provided in a meander configuration or in comb-like toothed engagement make it possible to produce resistors within the first electrically conducting functional layer.

In a preferred configuration of the invention one or more conductor tracks of the plurality of mutually parallel conductor tracks of the first electrically conducting functional layer in the at least one second portion are electrically connected by a connection extending transversely to the extent direction of the plurality of mutually parallel conductor tracks. Such a configuration has proven desirable in particular when producing source or drain electrodes of a field effect transistor.

In a preferred configuration of the invention the second electrically conducting functional layer comprises a conductive substance which can be applied by means of a printing process. It thus includes for example one or more organic materials selected from the group of PEDOT (PEDOT=poly (3,4-ethylene dioxythiophene)) or PANI (PANI=polyaniline). Those materials are suitable in particular for printing processes for producing the second electrically conducting functional layer.

It can further be provided that the electrically semiconducting functional layer and the insulating layer are formed from organic material. That makes it possible to form the electrically semiconducting functional layer and the insulating layer by means of a printing process.

In a preferred configuration of the invention the intermediate product is produced by means of a roll-to-roll process.

In a preferred configuration of the invention when individualizing the previously produced intermediate product, by shaping the second electrically conducting functional layer, a plurality of preferably different organic electronic circuits are produced and then individually separated.

The individual separation operation is effected by cutting the individualized film web. Preferably the one or more functional layers of the organic electronic circuit are produced by means of a printing process, in particular an intaglio printing process.

In a preferred configuration of the invention the electronic assembly has two or more components selected from the group of organic diode, organic field effect transistor, resistor and capacitor. The two or more components are produced by means of the second electrically conducting functional layer and connected together.

In particular it is possible for the organic electronic circuit to be provided as a component part of an organic RFID transponder (RFID=radio frequency identification). In that case it is possible for an antenna oscillating circuit which includes in particular an antenna coil and a capacitor plate of a capacitor to be arranged on a further substrate layer which is laminated on to the organic electronic circuit, providing the organic RFID transponder.

It can be provided that the electrically semiconducting functional layer is produced over the entire surface area.

The invention is described by way of example hereinafter by means of a number of embodiments with reference to the accompanying drawings.

Figure 2:
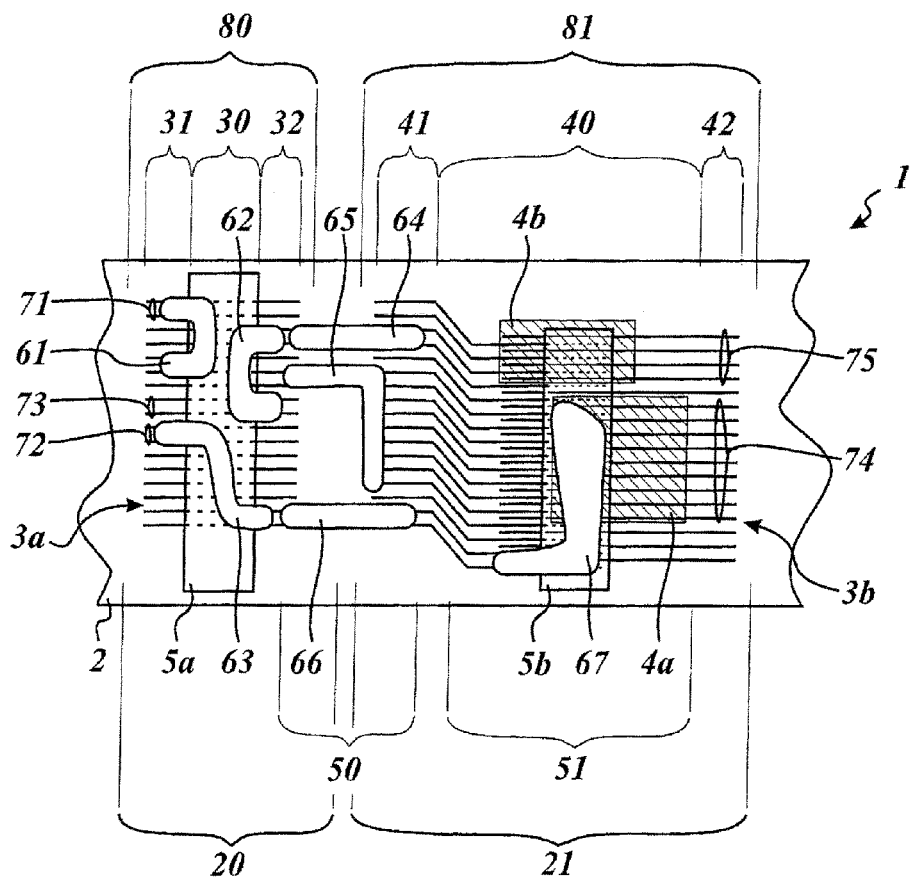
Figure 3:
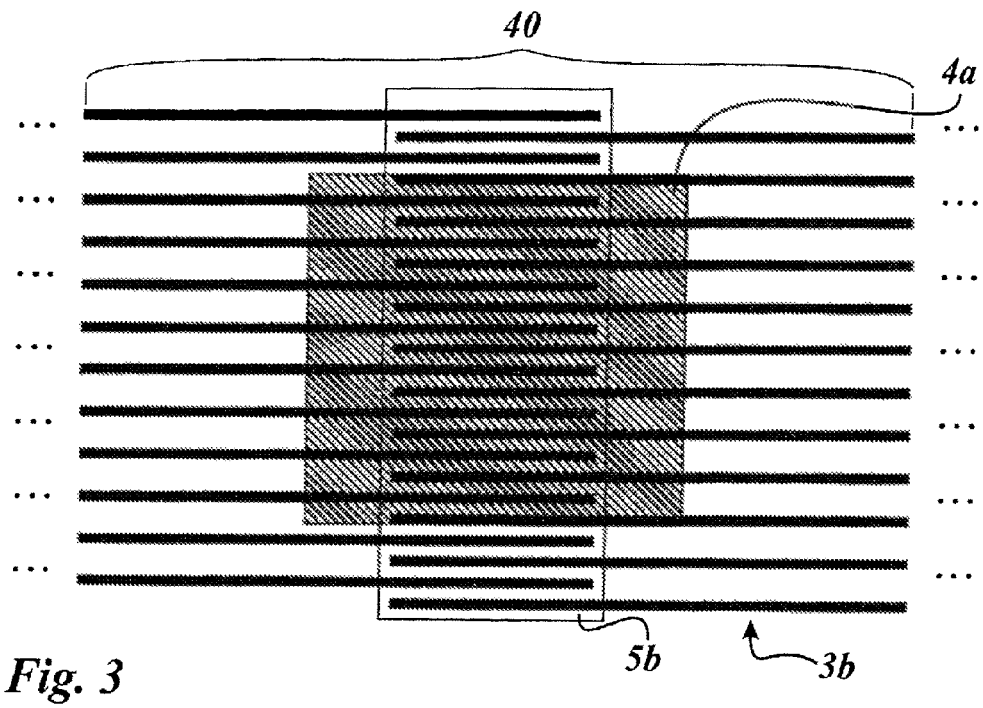
Figure 3A:
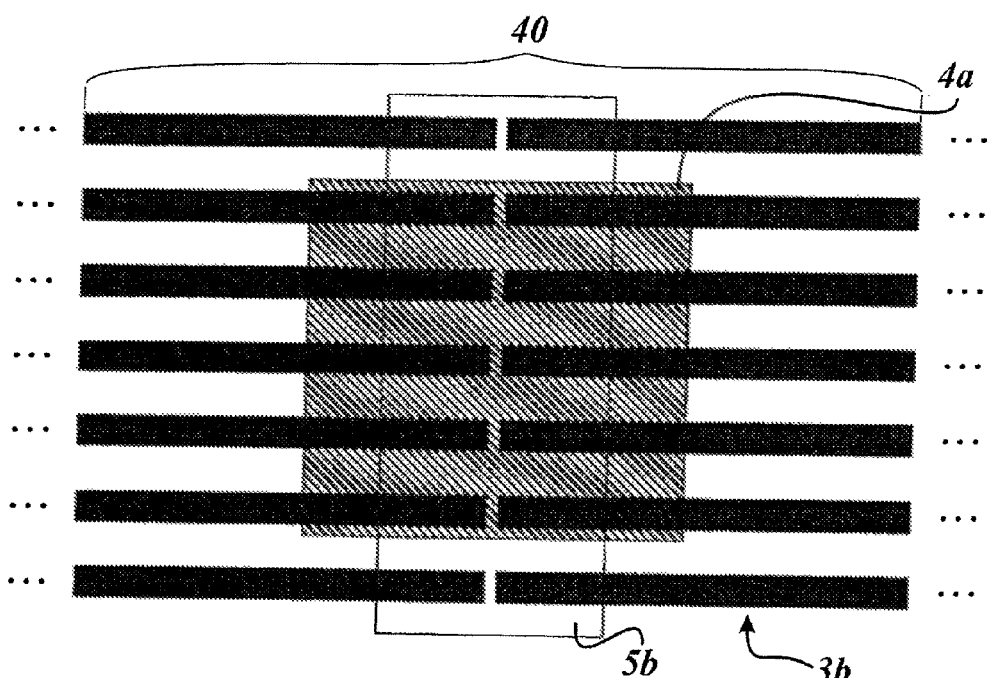
Figure 3B:
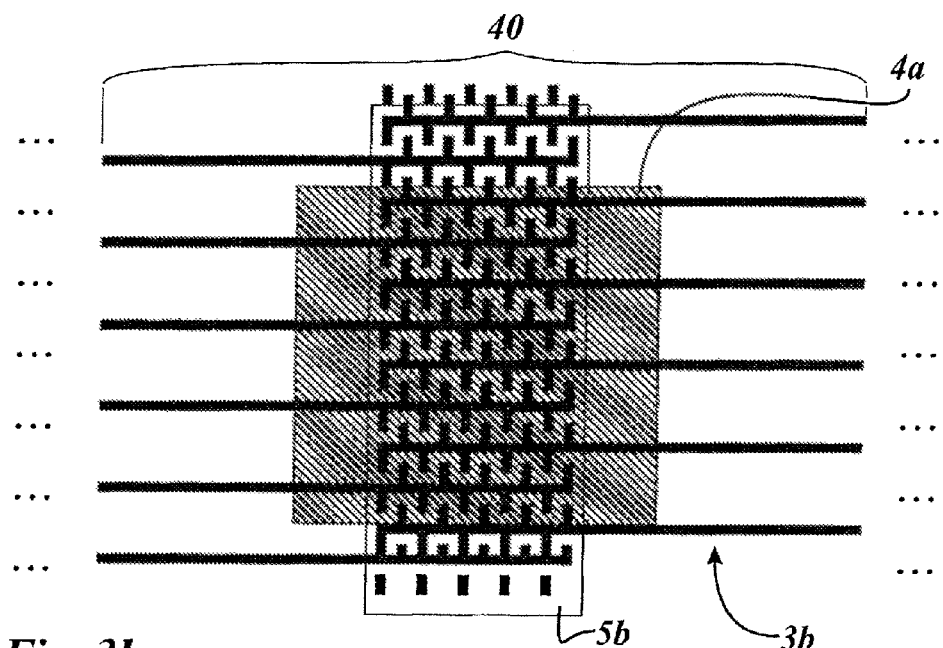
Figure 3C:
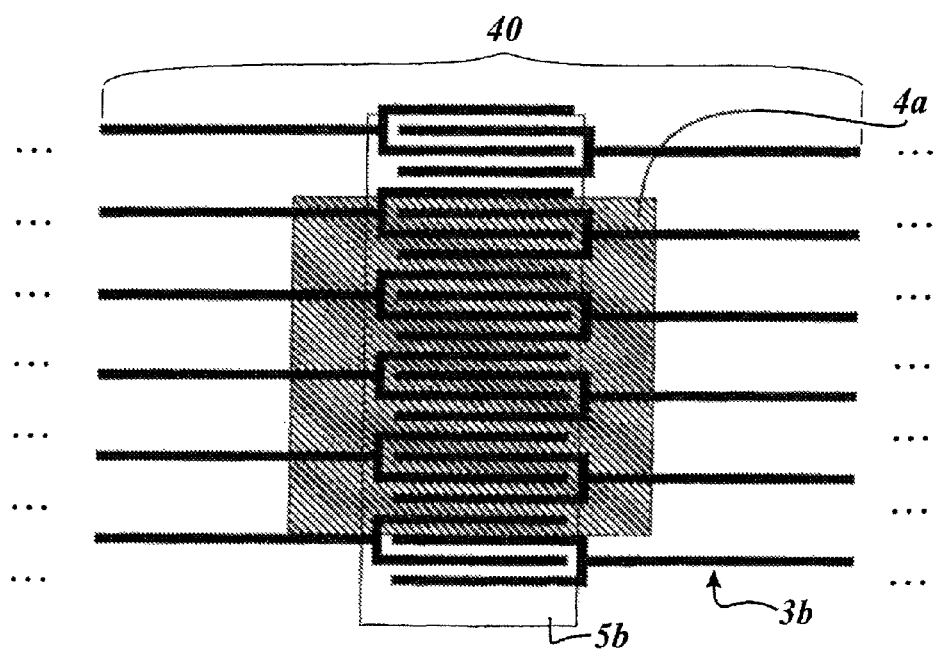

FIG. 1 shows a diagrammatic sectional view of an organic electronic circuit according to the invention, FIG. 2 shows a diagrammatic view of a portion of the organic electronic circuit according to the invention shown in FIG. 1, FIG. 3 shows a diagrammatic view of a portion of the organic electronic circuit according to the invention shown in FIG. 2, with an alternative arrangement of a first electrically semiconducting region, FIG. 3a shows a first alternative configuration of a plurality of structures, which are repeated in a preferred direction, of the first electrically conducting functional layer of the diagrammatic view shown in FIG. 3, FIG. 3b shows a second alternative configuration of a plurality of structures, which are repeated in a preferred direction, of the first electrically conducting functional layer of the diagrammatic view shown in FIG. 3, and FIG. 3c shows a third alternative configuration of a plurality of structures, which are repeated in a preferred direction, of the first electrically conducting functional layer of the diagrammatic view shown in FIG. 3.

FIG. 1 shows a diagrammatic sectional view of an organic electronic circuit 1 according to the invention. The organic electronic circuit 1 shown in FIG. 1 in the form of a multi-layer film body has a substrate layer 2, a first electrically conducting functional layer 3, an electrically semiconducting functional layer 4, an insulating layer 5 and a second electrically conducting functional layer 6.

The substrate layer 2 comprises a strip-shaped flexible plastic material. The substrate layer 2 comprises for example a PP film, in particular a BOPP film (BOPP=biaxially oriented polypropylene) or a PET film with a layer thickness of between 12 μm and 50 μm. The substrate layer 2 forms a carrier for the organic electronic circuit 1.

A first electrically conducting functional layer 3 is produced on the substrate layer 2. The first functional layer 3 is a metallic layer of a thickness of between 10 nm and 1 μm. The first electrically conducting functional layer preferably comprises aluminum, copper, gold or silver.

The electrically semiconducting functional layer 4 is produced in pattern form over the first electrically conducting functional layer 3 and is of a layer thickness of between 10 nm and 500 nm. The electrically semiconducting functional layer 4 in this case preferably comprises PHT (PHT=polyhexylthiophene) or ZnO. In addition an insulating layer 5 is arranged over the electrically semiconducting functional layer 4. The insulating layer 5 preferably comprises an electrically non-conducting polymer which is applied by printing in pattern form. The insulating layer 5 can also be formed by a PET film which is laminated on.

The multi-layer film body has over the insulating layer 5 a second electrically conducting functional layer 6 of a thickness of between 10 nm and 1 μm. The second electrically conducting functional layer 6 preferably comprises a printable electrically conductive material, in particular an organic compound, for example PEDOT or PANI, or a printing ink having conductive particles. In particular the electrically semiconducting functional layer 4 and the second electrically conducting functional layer 6 can be produced by intaglio printing using a roll-to-roll process.

FIG. 2 shows a diagrammatic view of a portion of the organic electronic circuit 1 shown in FIG. 1, in the form of a multi-layer film body. The organic electronic circuit 1 can have two or more portions, however by way of example only two portions 20, 21 are shown in FIG. 2. One of the two portions 20, 21 is in the form of a first portion 20 which is in the form of an interconnection assembly 80. The other portion 21, that is to say the second portion 21, is in the form of an electronic assembly 81. The two or more portions 20, 21 are arranged along the printing direction and along the extent direction along the strip-shaped substrate layer 2 by shaping of the functional layers, that is to say the electrically semiconducting functional layer 4, the insulating layer 5 and the second electrically conducting functional layer 6 of the organically electronic circuit 1, for example by means of an intaglio printing process. The interconnection assembly 80 and the electronic assembly 81 are produced in the functional layers by means of shaping thereof. The first electrically conducting functional layer 3, the electrically semiconducting functional layer 4, the insulating layer 5 and the second electrically conducting functional layer 6 are not shown in FIG. 2 in order to make the diagrammatic view as clear as possible. FIG. 2 shows the invention by way of example by reference to two portions 20, 21.

A plurality of mutually parallel conductor tracks 3a are produced in the first portion 20 in the first electrically conducting functional layer 3. In addition a plurality of conductor tracks 3b is also formed in the second portion 21 in the first electrically conducting functional layer 3. In a configuration which is not shown here it can be provided that the plurality of conductor tracks 3b are shaped in a straight line in the second portion 21, that is to say they do not involve any configuration which is angled portion-wise. In the second portion 21 the semiconducting functional layer 4 has a first electrically semiconducting region 4a and a second electrically semiconducting region 4b. Outside the first and second electrically semiconducting regions 4a and 4b the electrically semiconducting functional layer 4 does not have any semiconducting material. The insulating layer 5 has a first insulating region 5a in the first portion 20 and a second insulating region 5b in the second portion 21. The insulating layer 5 does not have any electrically insulating material outside the first and second insulating regions 5a and 5b. Seven electrically conducting connections 61, 62, 63, 64, 65, 66 and 67 are produced in the second electrically conducting functional layer 6. Outside the seven electrically conducting connections 61, 62, 63, 64, 65, 66 and 67 the second electrically conducting functional layer 6 does not have any electrically conductive material in that region.

Two adjacent conductor tracks 3a and 3b of the first electrically conducting functional layer 3 are spaced relative to each other at a spacing of some μm. That relatively fine structuring of the first electrically conducting functional layer 3 can be produced for example with the above-mentioned high-resolution structuring method on the substrate layer 2. In the portions 20 and 21 the plurality of mutually parallel conductor tracks 3a and 3b extend in the extent direction along the extent direction of the strip-shaped substrate layer 2. In particular the region between the first portion 20 and the second portion 21 in the first electrically conducting functional layer 3 is free of electrically conductive material. There is no conducting, in particular galvanic connection between the plurality of mutually parallel conductor tracks 3a and the plurality of mutually parallel conductor tracks 3b in the first electrically conducting functional layer 3.

In the first portion 20 the plurality of mutually parallel conductor tracks 3a in a central first zone 30 in the first insulating region 5a are covered by the insulating layer 5. In second zones 31, 32 arranged on both sides of the central first zone 30 the plurality of mutually parallel conductor tracks 3a are not covered by the insulating layer 5.

In the second portion 21 the plurality of mutually parallel conductor tracks 3b in a central first zone 40 in the first semiconducting region 4a and in the second electrically semiconducting region 4b are covered by the electrically semiconducting functional layer 4. In addition the plurality of mutually parallel conductor tracks 3b in a central first zone 40 in the second insulating region 5b are covered by the insulating layer 5. In second zones 41, 42 arranged on both sides of the central first zone 40 the conductor tracks 3b are covered neither by the insulating layer 5 nor by the electrically semiconducting functional layer 4.

The second zones 31, 32, 41, 42 are of a strip-shaped configuration and arranged transversely to the direction in which the strip-shaped substrate layer 2 extends. The second zones 31 and 32 of the first portion 20 and the second zones 41 and 42 of the second portion 21 are each provided at the edge in the respective portion 20 and 21. The second zones 31, 32, 41, 42 can be used for contacting and interconnection.

The second electrically conducting functional layer 6 has a first region 50 in which the second electrically conducting functional layer 6 contacts three times two conductor tracks of the first electrically conducting functional layer 3 in the portion 20 in the form of an interconnection assembly 80. In the portion 21 in the form of the electronic assembly 81 two times two and nine conductor tracks of the first electrically conducting functional layer 3 are partially covered over, producing three electrically conducting connections 64, 65, 66.

The second electrically conducting functional layer 6 has a second region 51, producing two electrical components.

A field effect transistor is provided having a large-area gate electrode 67 in the second electrically conducting functional layer, electrical insulation in the second electrically insulating region 5b, a semiconductor layer in the first electrically semiconducting region 4b, a drain electrode 74 in the first electrically conducting functional layer 3 and a source electrode in the first electrically conducting functional layer 3. The source electrode is connected by means of the conducting connection 65 in the second electrically conducting functional layer to the first electrically conducting functional layer 3. The gate electrode 67 partially covers over the second portion 21 in the form of an electronic assembly 81.

In addition a resistor is also produced in that second region 51. The resistor has an input 73 which is provided in the first portion 20 in the first electrically conducting functional layer 3 and is connected to the second portion 21 by means of the conducting connection 64 in the second electrically conducting functional layer 6. In this arrangement the input of the resistor 73 is connected with the conducting connection 64 in the first region 50 by means of the conducting connection 62 of the second electrically conducting functional layer 6. The resistor includes the electrically semiconducting material of the second electrically semiconducting region 4b. The resistor further has an output 75 provided in the first conducting functional layer 3b. The conducting connection 62 of a specific configuration is discussed in greater detail in the following paragraph. What is common to those two components, transistor and resistor, is that both components in the first electrically conducting functional layer 3 have conductor tracks 3b which are in toothed comb-like engagement with each other and said conductor tracks 3b are covered regionwise by the electrically semiconducting material of the first and second electrically semiconducting regions 4a and 4b respectively. The electrically semiconducting material of the first and second electrically semiconducting regions 4a and 4b is also arranged between the corresponding covered conductor tracks of the first electrically conducting functional layer 3.

It is also possible to provide a diode instead of the resistor in that second region 51. The diode would be of a similar structure to a Schottky diode. So that a diode can be produced, no insulating layer 5b would additionally be provided, as compared to the structure described hereinbefore, and the conducting connection 64 would be arranged in overlapping relationship with the output 75.

It can be provided that, in a preferred configuration of the invention, the electronic assembly 81 has two or more components selected from the group of organic component, organic field effect transistor, resistor and capacitor. The two or more components are formed by means of the second electrically conducting functional layer 6 and are connected together.

FIG. 2 shows how a conducting connection between the interconnection assembly 80 and the electronic assembly 81 is provided. The three conductor tracks 64, 65, 66 in the second electrically conducting functional layer 6 electrically conductingly connect the eight conductor tracks of the first electrically conducting functional layer 3 of the second zone 32 of the first portion 20 to the thirteen conductor tracks of the first electrically conducting functional layer 3 of the second zone 41 of the adjacent portion 21.

FIG. 2 further shows how a connection is effected within the interconnection assembly 80. Three conducting connections 61, 62, 63 are formed as an interconnection connection in the second electrically conducting functional layer 6 in the portion 20 in the form of the interconnection assembly 80. The three conducting connections 61, 62, 63 cross over in the central first zone 30 a total of nine conductor tracks of the first electrically conducting functional layer 3, namely the conducting connection crosses over two, the conducting connection 62 crosses over three and the conducting connection 63 crosses over four of the conductor tracks of the plurality of mutually parallel conductor tracks 3a of the first electrically conducting functional layer 3. So as to permit crossing of the plurality of mutually parallel conductor tracks 3a of the first electrically conducting functional layer 3 with conductor tracks in the second electrically conducting functional layer 6 without a conducting connection with respect to the first electrically conducting functional layer 3 in the central first zone 30, arranged in the central first zone 30 in the insulating layer 5 between the first and second electrically conducting functional layers 3 and 6 is respectively the electrically insulating material in the first electrically insulating region 5a. The three conducting connections 61, 62, 63 contact various conductor tracks and respectively cover over two conductor tracks of the first electrically conducting functional layer 3 in both second zones 31, 32 of the interconnection assembly 80. That crossing-over of the conductor tracks also provides for crossing over of signals which are passed in one or more of the conductor tracks of the plurality of mutually parallel conductor tracks 3a.

In the FIG. 2 embodiment therefore the conductor tracks 3a of the interconnection assembly 80, identified as 71, 72 and 73, can serve as contacts for a source signal of the field effect transistor, for a gate signal of the field effect transistor or for an input signal respectively. The conductor tracks 3b of the electronic assembly 81 identified by references 74 and 75 serve as contacts for a drain signal of the field effect transistor and for an output signal respectively.

FIG. 3 shows a diagrammatic view of a portion of the organic electronic circuit according to the invention as shown in FIG. 2, with an alternative arrangement of a first electrically semiconducting region 4a of the first central zone 40 of the electronic assembly 81. The semiconducting material of the electrically semiconducting functional layer 4 is arranged symmetrically relative to the conductor tracks 3b, which are in toothed comb-shaped engagement, of the first electrically conducting functional layer 3. In addition the semiconducting material of the first semiconducting functional layer 4 is arranged symmetrically relative to the second region 5b of the insulating layer 5.

The gate electrode 67 is not shown in FIG. 3 and following FIGS. 3a, 3b and 3c, for the sake of enhanced clarity of the drawing. The gate electrode 67 is shaped corresponding to the embodiment shown in FIG. 2.

FIG. 3a shows a first alternative configuration of the plurality of structures 3b which are repeated in a preferred direction, that is to say the plurality of conductor tracks 3b, which are shaped relative to each other, of the first electrically conducting functional layer 3, of the diagrammatic view shown in FIG. 3. In contrast to the preceding embodiment, shown in FIG. 3, those conductor tracks 3b are shaped with a greater width and not in toothed comb-shaped mutual engagement. Those conductor tracks 3b are shaped parallel to each other and butting against each other at their ends except for a gap.

FIG. 3b shows a second alternative configuration of the plurality of conductor tracks 3b, which are shaped relative to each other, of the first electrically conducting functional layer 3 in the diagrammatic view shown in FIG. 3. In contrast to the preceding embodiment, shown in FIG. 3, those conductor tracks 3b are shaped in toothed comb-shaped mutual engagement transversely relative to the extent direction. Those conductor tracks 3b are shaped on both sides with comb-shaped structures which in turn are shaped in mutually displaced relationship.

FIG. 3c shows a third alternative configuration of the plurality of mutually shaped conductor tracks 3b of the first electrically conducting functional layer 3 in the diagrammatic view shown in FIG. 3. In contrast to the preceding embodiment, shown in FIG. 3, those conductor tracks 3b are shaped in a fork-shaped configuration relative to each other. Those conductor tracks 3b have a fork-shaped structure with two fork prongs. The fork-shaped structures may also have three or more fork prongs.

In a preferred configuration which is not shown it is possible for at least one further conducting connection to be in the form of an interconnection connection in the second electrically conducting functional layer 6 in the at least one portion which is in the form of the interconnection assembly 80. The at least one conducting connection in the form of the inter-connection connection and the at least one further conducting connection contact different conductor tracks of the first electrically conducting functional layer 3. In the central first zone 30 the at least one further conducting connection in the form of the interconnection connection crosses over at least two or more conductor tracks, in particular each conductor track, of the first electrically conducting functional layer 3. The at least one further conducting connection is insulated by the first electrically insulating region 5a of the insulating layer 5 with respect to the first electrically conducting functional layer 3. The at least two or more conductor tracks, in particular each conductor track, are contacted with the at least one conducting connection in the form of the interconnection connection. The at least two or more conductor tracks however are not contacted with the at least one further conducting connection in the form of the interconnection connection. By virtue of such a configuration of interconnection connections which are provided only in the last, that is to say second, electrically conducting functional layer, it is possible to provide for any signal transmission, in particular crossing over or parallel displacement, of one or more signals. The configuration according to the invention of the organic electronic circuit permits a space-saving configuration thereof.

To provide a resistor and/or a coil in the first electrically conducting functional layer 3 it can be provided that, in a preferred embodiment of the invention which is not shown, one or more conductor tracks of the plurality of mutually parallel conductor tracks 3b of the first electrically conducting functional layer 3 in the at least one second portion 21 are at least partially in the form of tracks which are preferably provided in each other, of a meander-shaped configuration and/or a screw-shaped configuration.

In the process according to the invention for the production of an organic electronic circuit 1 in the form of a multi-layer film body firstly the organic electronic circuit 1 is divided into two or more portions 20, 21. An intermediate product of the organic electronic circuit 1 is produced by the first electrically conducting functional layer 3 being shaped on the substrate layer 2 and the electrically semiconducting functional layer 4 and the insulating layer 5 being further shaped on the first electrically conducting functional layer 3. The organic electronic circuit 1 is individualized by shaping a second electrically conducting functional layer 6 on the intermediate product of the organic electronic circuit 1. It is thus possible to use the intermediate product for different organic electronic circuits. The intermediate product according to the invention allows favorable and in particular fast mass production of, in particular individualized, organic electronic circuits 1.

The invention claimed is:

1. An organic electronic circuit comprising:
a multi-layer film body which has a substrate layer, a first electrically conducting functional layer, an electrically semiconducting functional layer, an insulating layer and a second electrically conducting functional layer;
wherein the organic electronic circuit has two or more portions;
wherein at least one first portion of the two or more portions is in the form of an interconnection assembly, and shaped in said at least one first portion in the first electrically conducting functional layer are a plurality of structures which are repeated in a first direction and which are respectively covered by the insulating layer in a central first zone having opposing sides and which are respectively not covered by the insulating layer in second zones, a second zone being at a respective one of the opposing sides of the central first zone, wherein at least one second portion of the two or more portions is in the form of an electronic assembly, and shaped in said at least one second portion in the first electrically conducting functional layer are a plurality of structures which are repeated in the first direction and which are respectively covered in a central first zone by the electrically semiconducting functional layer and/or the insulating layer and which are not covered by the insulating layer in at least one second zone arranged adjacent to an adjacent at least one first portion;

wherein the second electrically conducting functional layer has at least one first region in which the second electrically conducting functional layer partially covers over at least one of the structures of the first electrically conducting functional layer in the at least one first portion in the form of the interconnection assembly and at least one of the structures of the first electrically conducting functional layer in the at least one second portion in the form of the electronic assembly, forming one or more electrically conducting connections, and the second electrically conducting functional layer has at least one second region in which the second electrically conducting functional layer partially covers the at least one second portion, forming an electrical component.

2. The organic electronic circuit as set forth in claim 1 wherein the electrically semiconducting functional layer and/or the insulating layer are arranged between the first electrically conducting functional layer and the second electrically conducting functional layer.

3. The organic electronic circuit as set forth in claim 1 wherein the plurality of structures which are repeated in the first direction are shaped in the form of a plurality of mutually parallel conductor tracks in the first electrically conducting functional layer.

4. The organic electronic circuit as set forth claim 3 in wherein the plurality of mutually parallel conductor tracks of the first electrically conducting functional layer are so shaped that the conductor tracks of the at least one first and second portions are neither formed in mutually interengaging toothed comb-shaped relationship nor galvanically conductingly interconnected and/or the electrically conductive material of the first electrically conducting functional layer is not provided in an area between the at least one first and second portions.

5. The organic electronic circuit as set forth in claim 3 wherein the first and second portions each comprise a plurality of zones, shaped in the second electrically conducting functional layer in the at least one first portion of the interconnection assembly is at least one conducting connection in the form of an interconnection connection which in a central first zone is juxtaposed with at least two conductor tracks of the first electrically conducting functional layer and is insulated by the insulating layer with respect to the first electrically conducting functional layer and in one or in both of a second zone of the plurality of zones covers over at least two conductor tracks of the first electrically conducting functional layer and contacts same.

6. The organic electronic circuit as set forth in claim 5 wherein shaped in the second electrically conducting functional layer in the at least one first portion the interconnection assembly are two or more conducting connections in the form of interconnection connections which cover over and contact different conductor tracks of the first conductive layer.

7. The organic electronic circuit as set forth in claim 6 wherein at least one of the interconnection connections in the central first zone is juxtaposed with a conductor track of the first conductive layer, which is contacted by one of the other interconnection connections in one of the second zones.

8. The organic electronic circuit as set forth in claim 3 wherein the conductor tracks of the plurality of mutually parallel conductor tracks of the first electrically conducting functional layer are spaced from each other at a spacing of between 0.1 µm and 50 µm in each of the at least one first and second portions.

9. The organic electronic circuit as set forth in claim 3 wherein the conductor tracks of the plurality of mutually parallel conductor tracks of the first electrically conducting functional layer in the at least one second portion are at least portion-wise arranged in mutually interengaging one of toothed comb-shaped relationship or shaped in a meander shape.

10. The organic electronic circuit as set forth in claim 3 wherein the conductor tracks of the plurality of mutually parallel conductor tracks of the first electrically conducting functional layer in the at least one second portion are electrically connected by a connection extending transversely to an extent direction of the plurality of mutually parallel conductor tracks, the extent direction being transverse to the first direction.

11. The organic electronic circuit as set forth in claim 1 wherein the two or more portions of the organic electronic circuit are arranged in a row in mutually juxtaposed relationship along an extent direction.

12. The organic electronic circuit as set forth in claim 11 wherein each of the first and second portions include first and second zones, one or two of the second zones in each of the portions of the two or more portions of the organic electronic circuit are strip-shaped and the longitudinal direction thereof is oriented transversely, to the extent direction.

13. The organic electronic circuit as set forth in claim 12 wherein the first and second portions are adjacent, each having an edge, the one or two strip-shaped second zones are arranged at the edge of and adjacent to the respective adjacent portion of their respective portion.

14. The organic electronic circuit as set forth in claim 1 wherein the substrate layer is of a strip-shaped configuration.

15. The organic electronic circuit as set forth in claim 1 wherein three or more zones of the at least one first and second portions form a succession in which the first portion interconnection assembly is adjacent to the second portion forming the electronic assembly.

16. The organic electronic circuit as set forth in claim 1 wherein the first portion comprises a plurality of zones and two or more of the zones form a succession in which the first and the last zone of the succession form at least part of the interconnection assembly.

17. The organic electronic circuit as set forth in claim 1 wherein the second portion comprises a plurality of zones and two or more zones form a succession in which two zones of the succession form part of the second portion of the electronic assembly.

18. The organic electronic circuit as set forth in claim 3 wherein the first and second portions each comprise a plurality of zones, the electrically conducting connections in the second electrically conducting functional layer cover over and contact conductor tracks of portions adjacent in a respective zone, the conductor tracks being provided in the first electrically conducting functional layer.

19. The organic electronic circuit as set forth in claim 1 wherein the electronic assembly has two or more components selected from the group of organic diode, organic field effect transistor, resistor and capacitor, wherein the two or more components are produced by the formation of the second electrically conducting functional layer and are connected together.

20. The organic electronic circuit as set forth in claim 1 wherein the substrate layer includes a plastic film and the substrate layer is of a thickness of between 10 μm and 250 μm.

21. The organic electronic circuit as set forth in claim 1 wherein the first electrically conducting functional layer is a metallic layer which has one or more metals selected from the group of gold, copper, aluminum and silver.

22. The organic electronic circuit as set forth in claim 1 wherein the plurality of mutually parallel conductor tracks of the first electrically conducting functional layer in the at least one first and/or second portion extend in a longitudinal direction in an extent direction transverse to the first direction.

23. A process for the production of at least one organic electronic circuit in the form of a multi-layer film body, preferably as set forth in claim 1,
wherein the process has the following process steps:
producing an intermediate product by forming on a substrate layer the first electrically conducting functional layer and further forming on the first electrically conducting functional layer the electrically semiconducting functional layer and the insulating layer such that the interconnection assembly is produced in the at least one first portion and in that shaped in said at least one first portion in the first electrically conducting functional layer are a plurality of structures which are repeated in the first direction and which are respectively covered by the insulating layer in a central first zone and which are respectively not covered by the insulating layer in second zones respectively arranged on the opposing sides of the central first zone;
producing an electronic assembly portion in at least one second portion and, in that shaped in said at least one second portion in the first electrically conducting functional layer are a plurality of structures which are repeated in the first direction and which are respectively covered in a central first zone by the electrically semiconducting functional layer and/or the insulating layer and which are not covered by the insulating layer in at least one second zone arranged adjacent to a central first zone; and
individualizing the at least one organic electronic circuit by producing a second electrically conducting functional layer on the intermediate product such that the second electrically conducting functional layer has at least one first region in which the second electrically conducting functional layer partially covers over at least one of the structures of the first electrically conducting functional layer in the at least one first portion and at least one of the structures of the first electrically conducting functional layer in the at least one second portion, producing one or more electrically conducting connections, and the second electrically conducting functional layer has at least one second region in which the second electrically conducting functional layer partially covers over the at least one second portion, producing an electrical component, comprising one of an organic diode or an organic field effect transistor.

24. The process for the production of at least one organic electronic circuit as set forth in claim 23 wherein the first electrically conducting functional layer is shaped in structured form by one of printing process or a high-resolution structuring method.

25. The process for the production of an organic electronic circuit as set forth in claim 23 wherein the electrically conducting functional layer and the insulating layer are produced by printing.

26. The process for the production of an organic electronic circuit as set forth in claim 23 wherein a film web is used as a carrier layer and the one or more first and second portions are produced in succession in an extent direction oriented transversely relative to the longitudinal direction of the film web.

27. The process for the production of an organic electronic circuit as set forth in claim 26 wherein the one or more of the first and second portions extend over the entire length of the film web.

28. The process for the production of at least one organic electronic circuit as set forth in claim 23 wherein the intermediate product is produced in a roll-to-roll process.

29. The process for the production of at least one organic electronic circuit as set forth in claim 23 wherein the intermediate product is individualized to produce a plurality of in particular different organic electronic circuits by forming the second electrically conducting functional layer and the electronic circuits and then individually separating the intermediate products.

30. The process for the production of least one organic electronic circuit in the form of a multi-layer film body as set forth in claim 23 wherein the second electrically conducting layer is structured by a digital structuring process comprising digital printing.

31. The organic electronic circuit as set forth in claim 1 wherein the second electrically conducting functional layer partially covers the at least one second portion forming an electrical component comprising at least one of an organic diode or organic field effect transistor.

* * * * *